United States Patent
Xiao et al.

(10) Patent No.: US 8,383,200 B2
(45) Date of Patent: Feb. 26, 2013

(54) HIGH HARDNESS NANOCOMPOSITE COATINGS ON CEMENTED CARBIDE

(75) Inventors: Xingcheng Xiao, Troy, MI (US); Leonid C. Lev, West Bloomfield, MI (US); Michael J. Lukitsch, Marysville, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 427 days.

(21) Appl. No.: 12/472,459

(22) Filed: May 27, 2009

(65) Prior Publication Data

US 2010/0303565 A1 Dec. 2, 2010

(51) Int. Cl.
*C23C 16/00* (2006.01)

(52) U.S. Cl. .................. 427/249.1; 427/248.1

(58) Field of Classification Search ............... 427/249.1, 427/248.1
See application file for complete search history.

(56) References Cited

U.S. PATENT DOCUMENTS

| | | | |
|---|---|---|---|
| 4,150,195 A * | 4/1979 | Tobioka et al. ............... 428/548 |
| 4,707,384 A * | 11/1987 | Schachner et al. ....... 427/249.14 |
| 5,100,703 A * | 3/1992 | Saijo et al. .................. 427/249.7 |
| 5,718,948 A * | 2/1998 | Ederyd et al. ............ 427/249.13 |
| 6,228,483 B1 * | 5/2001 | Sarin .............................. 428/336 |
| 6,800,383 B1 | 10/2004 | Lakhotkin |
| 2005/0069709 A1 | 3/2005 | Lev et al. |
| 2010/0104860 A1* | 4/2010 | Chou et al. .................... 428/332 |

FOREIGN PATENT DOCUMENTS

| | | |
|---|---|---|
| CN | 1342215 | 3/2002 |
| CN | 1482275 | 3/2004 |
| CN | 1859985 | 11/2006 |
| WO | 2006/085925 | 8/2006 |

* cited by examiner

*Primary Examiner* — Kelly M Gambetta
(74) *Attorney, Agent, or Firm* — Reising Ethington P.C.

(57) ABSTRACT

A method of creating adherent surface coatings on carbide cutting tools or other workpiece substrates through the development of polycrystalline diamond coatings or composite coatings comprising a refractory metal carbide and polycrystalline diamond is described. The coating is deposited through a sequenced chemical vapor deposition process, first using a specified gas mixture of hydrogen and a refractory metal halide to deposit a base layer of a refractory metal carbide. This step is followed by a second step in which polycrystalline diamond is deposited from a gas mixture comprising a hydrocarbon and hydrogen. Co-deposition of refractory metal carbide and diamond in the second step to create a toughened diamond coating is also contemplated.

18 Claims, 2 Drawing Sheets

US 8,383,200 B2

HIGH HARDNESS NANOCOMPOSITE COATINGS ON CEMENTED CARBIDE

TECHNICAL FIELD

This invention relates to improved methods of depositing polycrystalline diamond coatings or polycrystalline diamond-containing, tungsten carbide-reinforced coatings on sintered carbide articles. The invention has particular application to cutting surfaces of sintered carbide cutting tools to promote superior adhesion of a diamond-containing coating.

BACKGROUND OF THE INVENTION

Cutting tools are used to remove metal as chips from a metal workpiece. Such tools have evolved into many specialized shapes but universally comprise a cutting edge which is urged into moving contact with the workpiece for removal of metal in shaping the workpiece. In the automobile industry, for example, cast silicon-containing aluminum alloys are used to form engine blocks and metal is cut from the cast surfaces, using cutting tools such as drills, boring bars and face mills, to give shape to the engine block.

Tool cutting edges are subjected to high loading and high temperatures as well as mechanical and thermal shock and this difficult environment leads to degradation of the cutting edge. When the edge degradation reaches unacceptable levels the cutting process must be interrupted and the tool must be replaced or re-sharpened, which has prompted continuing investigations into new or improved cutting tool materials in an effort to prolong useful tool life. Currently carbide tools generally comprising hard particles of tungsten carbide held in a metal matrix, usually cobalt, are the preferred tools for general purpose metal machining. Sometimes nickel and/or chromium are used in the metal matrix binder. The metal matrix typically makes up about five to ten percent by volume of the tungsten carbide plus matrix volume. Carbide particles sizes often range from about 1.5 to about ten micrometers in largest dimension (sometimes classified as from fine to medium).

However carbide tools are challenged by machining the aluminum-silicon engine alloys used by the automobile industry since the hard silicon particles in the alloy promote rapid tool wear. One approach to reducing the wear rate is to apply a hard, wear-resistant surface coating to the carbide tool, and for this application, diamond coatings have been preferred, but achieving good adhesion between the diamond coating and the carbide tool can be difficult. Thus there is a need for a process to deposit an adherent diamond or diamond-containing coating on carbide tools.

SUMMARY OF THE INVENTION

This invention provides a method of forming more adherent polycrystalline diamond coatings on metal carbide particle-metal matrix substrates. The diamond-containing coating layer displays improved durability and adherence to such bonded carbide substrates. In a first step, a polycrystalline refractory carbide layer, which may be tungsten carbide, is deposited on the substrate. This carbide layer is deposited from a gas to serve as a uniform, co-extensive (with a desired substrate area) base layer to provide adherence for a subsequently applied polycrystalline diamond coating. A polycrystalline diamond coating is then deposited from a suitable gas composition on the base layer. In some embodiments of this invention, the diamond coating may contain particles of a refractory carbide co-deposited with and distributed in it, or, alternatively the coating may contain diamond co-deposited with and distributed in a refractory carbide. This diamond coating has particular utility on cutting tools, especially cutting surfaces for such tools, and may reduce the need for a machining coolant or lubricant. But, it is recognized that such refractory metal carbide-diamond composite coatings add value to other metal-bonded metal carbide particle articles.

These tool substrates (for use in this invention) are prepared by generally-conventional powder processing techniques involving powder pressing of the carbide particles and binder particles followed by sintering of the powder compact. Cobalt is often used as the binder or bonding matrix material. However, in some embodiments, nickel or chromium may be used as the bonding material, and mixtures of two or more of chromium, cobalt, and nickel have been used.

While a diamond coating or layer provides benefit in enhancing the durability of carbide cutting tools, the composite nature of the tool i.e. a mixture of carbide and metallic binder complicates the diamond deposition process. Diamond is deposited as individual carbon atoms which bond together on the substrate on which they are deposited. Carbon however may exist in other crystalline or pseudo-crystalline forms in addition to diamond and the nature of the substrate is largely controlling as to whether the deposited carbon is laid down as diamond or as another form of carbon.

Carbide tools typically have two substrate constituents or phases, and while the carbide particles at the substrate surface promote the desired diamond deposit, the metallic binder, particularly if cobalt or nickel, tends to promote graphite deposition. Graphite is undesirable not only because it is a soft lubricious material which fails to provide the desired hard durable tool coating but also because it promotes de-cohesion and flaking off of the diamond layer which forms on the carbide. Thus, in accordance with this invention, deposition of a first layer of refractory metal carbide material prepares the tool surface for subsequent deposition of diamond by providing a chemically compatible, homogenous deposition surface.

In practices of this invention, such a carbide workpiece is prepared so that a surface of a metal-bonded tungsten carbide substrate is suitably clean and has a suitable texture for initial deposition of a refractory metal carbide. After the refractory metal carbide has been deposited so that the entire tool surface is covered with a homogeneous layer of refractory metal carbide, polycrystalline diamond is deposited onto the carbide-coated substrate. This is accomplished by varying the gas composition used for the deposition process. Initially the gas mixture comprises hydrogen and a refractory metal halide gas enabling deposition of the refractory metal carbide. Then, for deposition of polycrystalline diamond, a gas mixture comprising a hydrocarbon and hydrogen is used. Considerable flexibility is afforded in the transition between these cases since if the gas mixture comprises a refractory metal halide, a hydrocarbon and hydrogen, diamond and a refractory metal carbide may be co-deposited enabling formation of a composite outer coating layer. This enables the carbide content of a transition from the refractory metal carbide base layer into a polycrystalline diamond layer to be abrupt or gradual in the deposited layer, and enables a gradient in composition and structure of the over-deposit which may extend through a desired thickness of the deposited layer.

The substrate region will generally encompass substantially the whole tool surface but, through appropriate masking, it may be restricted to only a selected region such as a cutting edge of the tool.

The deposition of both the refractory metal carbide and the diamond is performed using a chemical vapor deposition process and may be facilitated by activating the gas with, for example, microwave radiation or hot filaments near the substrate surface. For carbon deposition, the deposition process is managed so that carbon is deposited substantially as diamond with a preponderance of $sp^3$ carbon-carbon bonding with minimal proportion of the $sp^2$ carbon-carbon bonding characteristic of graphite. A coating of this type with some $sp^2$ bonding character is sometimes described as diamond-like rather than diamond but, for brevity, this application will continue to identify the coating as diamond.

Diamond clusters will nucleate and form on a tungsten carbide base layer. Thus, the refractory metal carbide may be selected to be tungsten carbide and deposited from a gas mixture comprising tungsten hexafluoride and hydrogen. Good adhesion will obtain between the deposited tungsten carbide and the substrate tungsten carbide as well as between the deposited tungsten carbide and the cobalt binder. Hence, deposition of tungsten carbide will create a chemically homogeneous base layer for diamond deposition and also strongly adhere to the carbide substrate.

Thus, the inventor has made the unexpected and surprising discovery that through control of the deposition process, particularly the gas composition and temperature, it is possible to generate a surface suitable for the development of an adherent diamond coating.

Other objects and advantages of the invention will become more apparent from a description of exemplary preferred embodiments which follow.

DESCRIPTION OF PREFERRED EMBODIMENTS

Figure 1:
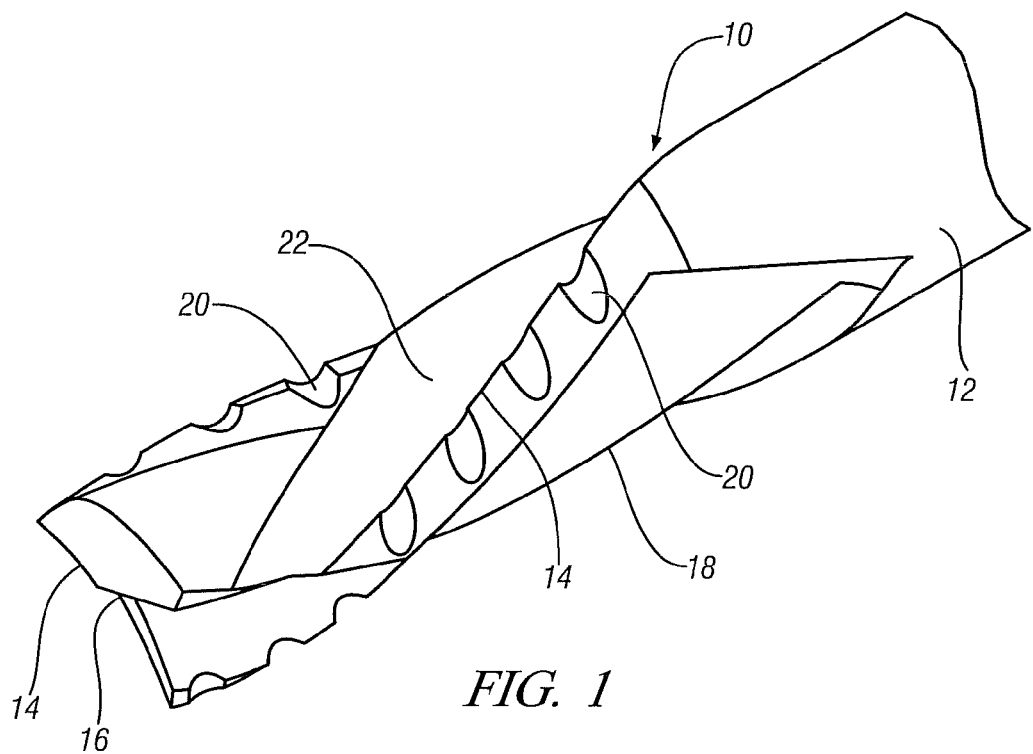
FIG. 1 shows an example of a representative carbide cutting tool, an end mill, suitable for the practice of this invention. This tool is indicative of the complex workpiece and substrate geometries which may be treated by this invention.

The practice of this invention has been discussed in the context of its utility for one application of carbide, cutting tools, one example of which is shown in FIG. 1. This tool 10 is secured to a chuck or collet in a milling machine by shank 12 and has multiple cutting edges 14, not all of which are called out, both on its underside 16 and along the length of the tool 18. This tool is intended for rapid metal removal, 'roughing', and has chip splitting features 20 on the cutting edges 14 which extend along the length of the tool 18. These chip splitters 20 are intended to fragment the chip into smaller more manageable metal fragments. Helical grooves 22, 'flutes' run from tool underside 16 to almost shank 12 and serve to transport and discharge the machining chips. With the exception of the shank 12, the cited elements of this tool are subject to one or more of: significant loads due to metal cutting; elevated temperatures; and abrasion due to the transit of metal chips during process of their removal or due to rubbing of the tool on the machined surface. Thus all the features described will benefit from diamond deposition, necessitating a deposition process capable of depositing diamond over this complex tool geometry.

The hardness and wear resistance of carbide however render it suitable for a variety of applications including: bushings, including drill bushings; seal rings; nozzles; dies; guides, rollers and wear strips; punches and pins. This invention is broadly directed towards a means of developing improved diamond coatings on carbide and thus any article fabricated from carbide may act as a substrate for deposition of diamond and thereby benefit from this invention. Thus discussion of its application to cutting tools is intended as exemplary and not limiting.

A wide range of carbide tools is available. These tools differ in:

a) The quantity of the metallic binder phase. A preferred range of binder constituent is 5.5% by weight (employed, for example in ISO—International Standards Organization—grades K01 and P15) to 11% by weight (employed, for example, in ISO grades K30 and P45).

b) The nature of the metallic binder phase. Typically this is cobalt, as for example in the ISO K and P grades mentioned previously, but nickel and chromium are also used, though far less frequently.

c) The nature of the hard particle. Typically this is tungsten carbide but micrograin grades incorporating vanadium or chromium carbide in quantities in the tenths of a percent range, and alloyed grades incorporating titanium carbide, tantalum carbide and niobium carbide in the several percent range are also available.

d) The size of the hard particle. The sharpness of the tool edge depends on the hard particle size. Thus tools intended for roughing cuts will typically have coarser particles than tools intended for finishing cuts.

This invention is generally applicable to all members of the material family collectively described as 'carbide', that is the composite material comprising particles of an at least one metal carbide chemical compound dispersed in a metal binder which surrounds and secures the particles. The invention is particularly suitable for those materials where the metallic binder phase is cobalt or nickel since the process conditions identified by this inventor effectively suppress the undesired formation of graphite in these binder materials. This result contrasts with the results of conventional CVD diamond deposition procedures.

Cleaning requirements are minimal, and require only that the surface be free of grease or oil. This may be accomplished through ultrasonic cleaning using a suitable solvent, for example acetone followed by methanol or ethanol and subsequent drying.

The cleaned tool is placed in a CVD chamber at elevated temperature and the CVD process conducted, preferably with plasma assist while exposing the tool to a mixture of gases comprising a gaseous halogenated compound of a refractory metal, a gaseous hydrocarbon, hydrogen gas and, optionally, an inert gas. The definition of refractory metals is not universal. For purposes of this invention, the refractory metals are; titanium; zirconium; vanadium; niobium; tantalum; chromium; molybdenum; and tungsten.

The gaseous halogenated compound of a refractory metal is preferably based on tungsten or molybdenum and may be based on either a fluoride or a chloride, provided the gas does not spontaneously decompose at the operating temperature. The bromide and iodide are acceptable, subject again to the chemical stability requirement, but are not preferred.

The preferred gaseous hydrocarbon is methane ($CH_4$) but others may also be used including higher alkanes, alkenes, alkynes, cycloalkanes and arenes. The preferred inert gas is argon but other inert gases such as helium and neon may also be used. The total chamber pressure should be maintained between 10 and 100 torr and the preferred reaction temperature is approximately 800° C. A lower bound on the temperature is approximately 600° C. corresponding to a minimally acceptable quality of the diamond coating while an upper bound is approximately 1000° C. corresponding to the onset of graphitization even in the presence of the $WF_6$.

The deposition process may be conducted using either of plasma or hot filament deposition processes. Both systems can be used to synthesize diamond, but the plasma CVD system affords more uniform coatings on tools of complex geometry and is thus preferred.

The process is controlled through control of the gas composition to promote, at different times in the process, one of the two following general reactions.

$$n(RM)(Hal)_x + C_nH_m + qH_2 = n(RM)C + xnH(Hal) \quad (1)$$

$$C_nH_m = nC(Diamond) + (m/2)H_2 \quad (2)$$

Where:
RM is a Refractory Metal;
Hal is a halogen;
$(RM)(Hal)_x$ is a gaseous halogenated compound of a refractory metal, composed of a refractory metal (RM), here assumed to have a valence state of (+x), and a halide (Hal);
$C_nH_m$ is a hydrocarbon containing n atoms of carbon C per m atoms of hydrogen H.
"n", "m", "q" and "x" are numerical constants, corresponding to the number of atoms needed to equilibrate the reaction and:

$$q = \frac{x \times n - m}{2}$$

As a specific example of such a reaction pair consider the following model reactions involving tungsten hexafluoride ($WF_6$) and methane ($CH_4$) which will be used as the basis for future discussion:

$$WF_6 + CH_4 + H_2 = WC + 6HF \quad (3)$$

$$CH_4 = C(Diamond) + 2H_2 \quad (4)$$

Initially, the reaction described by equation (3) is favored by introducing tungsten hexafluoride, methane and hydrogen in stoichiometric proportions dictated by equation (3) so that the initial material deposited will be tungsten carbide. The tungsten carbide serves three functions: it acts as a barrier between the cobalt and the subsequently-deposited diamond; it forms a strong bond to the tungsten carbide and the cobalt; and it creates nuclei for subsequent diamond deposition. It may be noted that in addition to tungsten carbide, hydrofluoric acid (HF) is also a reaction product. This, particularly in the very early stages of the process, is anticipated to play a beneficial role in further cleaning the surface to promote good adhesion.

Figure 2:
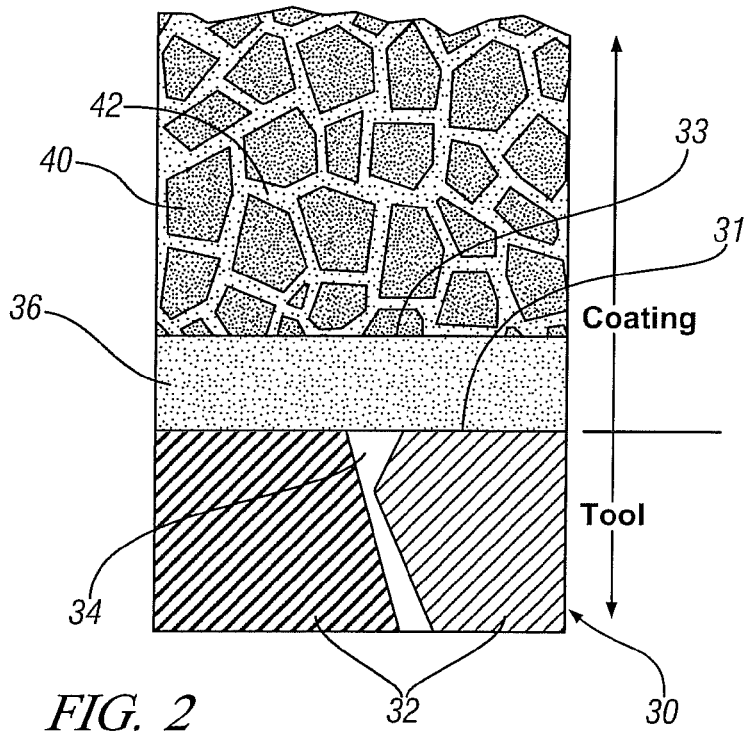
FIG. 2 is a schematic view of a fragmentary cross-section of another embodiment of a coating deposited by the practice of this invention, illustrating its relationship to the carbide tool substrate. In this embodiment a layer of tungsten carbide is deposited initially followed by co-deposition of tungsten carbide and diamond to create an adherent composite coating of a diamond and tungsten carbide layer on a deposited tungsten carbide substrate.
Figure 3:
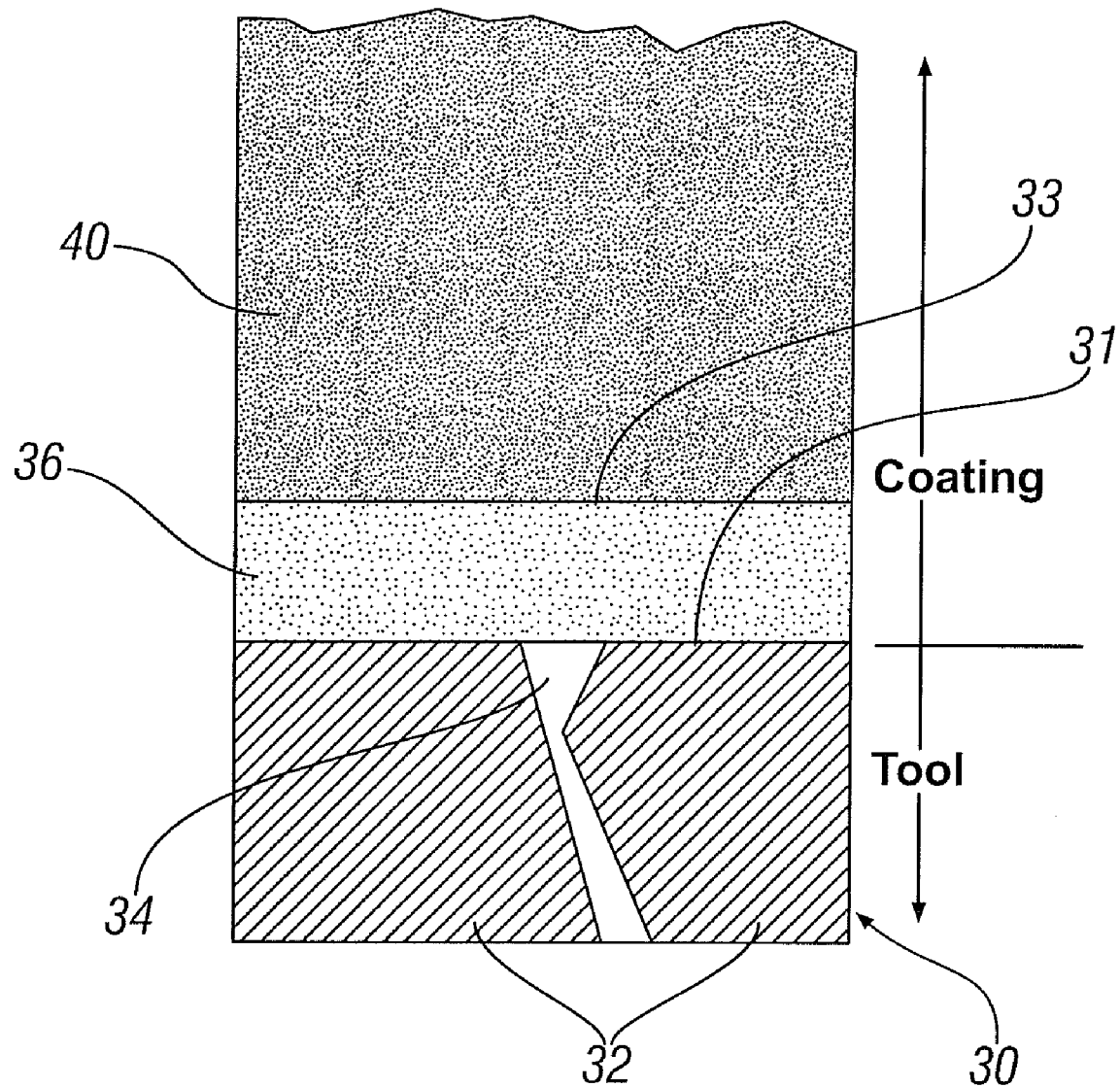
FIG. 3 is a schematic view of a fragmentary cross-section of one embodiment of a coating deposited by the practice of this invention, illustrating its relationship to the carbide tool substrate. In this embodiment a layer of tungsten carbide is deposited initially followed by deposition of polycrystalline diamond to create an adherent polycrystalline layer on a deposited tungsten carbide substrate.

Thus, initially, as shown in FIGS. 2 and 3, the substrate surface 31 of tool 30, comprising carbide particles 32 and metallic binder 34 is covered by a layer 36 of refractory metal carbide, in this example tungsten carbide, which provides a new surface 33 uniformly comprising grains or crystals of tungsten carbide and suitable for further deposition.

As deposition proceeds, the concentration of $WF_6$ and hydrogen are progressively reduced in stoichometric ratio to promote the reaction of equation (4). Depending on whether or not some residual concentration of $WF_6$ is maintained in the reaction gas mixture, the next-deposited layer may be a composite coating of nanocrystalline diamond 40 and tungsten carbide 42 as shown in FIG. 2 or only polycrystalline diamond 38 as shown in FIG. 3.

FIGS. 2 and 3 are fragmentary views of two carbide tool substrates with tungsten carbide base layers and different embodiments of polycrystalline diamond over-layers and composite polycrystalline diamond-refractory metal carbide over-layers. These diamond-containing over-layers will be shaped to provide a cutting surface or cutting edge in carbide tool embodiments. And an over-layer will be suitably shaped for its intended purpose in other articles with such coated carbide substrates.

Those skilled in the art will appreciate that composites are generally described as comprising a continuous phase and a discontinuous phase. As shown in FIG. 2, the carbide phase 42 is continuous and the diamond phase 40 is discontinuous. However, by adjustment of the gas composition it is possible to reverse the fractions and contributions of these phases to create a second-deposited layer comprising polycrystalline diamond as a continuous phase and refractory metal carbide as a discontinuous phase.

The intent of initially introducing the $WF_6/H_2$ gas mixture is to promote formation of tungsten carbide on the metallic binder and thereby shield the reactive gas mixture formulated to deposit carbon as polycrystalline diamond from exposure to the metallic binder material. Hence, the gas mixture suitable for formation of WC may be transitioned to the gas mixture suitable for diamond deposition as soon as the metallic binder (binder 34 in FIGS. 2 and 3) is fully coated with a suitably thick layer of tungsten carbide (36 in FIGS. 2 and 3). This time may vary somewhat based on the specific process parameters in use but will generally not exceed two hours. The first-deposited tungsten carbide substrate will be polycrystalline and the resulting grain boundaries will be preferred nucleation sites for the diamond particles. By way of example, and not of limitation of practices of the invention, the tungsten carbide base layers may be a few nanometers or more in thickness depending in part on the roughness of the original carbide substrate surface.

For some applications the composite layer of tungsten carbide and nanocrystalline diamond shown in FIG. 2 may yield satisfactory cutting performance and an exclusively diamond coating may not be necessary. Such a composite film may exhibit increased fracture toughness, rendering it more resistant to shock loading which leads to chipping and fracture. In general, polycrystalline single phase ceramics, like polycrystalline diamond and polycrystalline carbide, have relatively poor fracture toughness. However those skilled in the art of ceramic processing will recognize that addition of a second phase, even a second ceramic phase, can be effective in imparting enhanced fracture toughness to a composite ceramic. Second phases added as particles are less effective than those present in other geometric configurations. However, it is expected that a polycrystalline diamond-carbide composite, would provide enhanced fracture toughness over polycrystalline diamond alone. Analogously a polycrystalline carbide-diamond composite would be expected to offer enhanced toughness over polycrystalline carbide alone. Thus it might be desirable to maintain the three chemically-active gases, that is, hydrogen, hydrocarbon and halogenated refractory metal throughout the CVD process to fabricate the composite coating shown schematically in FIG. 2.

For those applications where an essentially diamond coating is desired then the flow of $WF_6$ may be cut off completely. This, coupled with a flow of only sufficient hydrogen to control the rate of diamond deposition, will result in only the reaction of equation (4) occurring and a film composed of only diamond will develop as shown schematically in FIG. 3.

The process may be carried out over a period of 4-10 hours at the discretion of the operator, the selected time depending on the desired coating thickness (base layer plus diamond-containing layer), generally up to 30 micrometers is preferred, and the desired chemical complexity of the deposit. It will be appreciated that the process has been described in terms of an abrupt modification of the gas composition and hence in terms of the abrupt or step changes in the resulting deposit composition represented in FIGS. 2 and 3. However the process may also be carried out using progressively varying gas compositions in which case the deposited film will exhibit a more smoothly-varying composition than depicted in FIGS. 2 and 3.

While the invention has been described by way of example and in terms of the preferred embodiments, it is to be understood that the invention is not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

The invention claimed is:

1. A method for depositing an adherent diamond-containing coating on a surface of a substrate comprising metal carbide particles in a metallic binder, the method comprising:
contacting the substrate with a gaseous mixture comprising predetermined amounts of a gaseous refractory metal halide, a gaseous hydrocarbon, and hydrogen to deposit a base layer consisting essentially of a refractory metal carbide on the substrate, the base layer covering the metal carbide particles and the metallic binder exposed at the surface of the substrate; and, thereafter
progressively reducing the concentration of the gaseous refractory metal halide and hydrogen in the gaseous mixture to deposit an adherent composite coating having a refractory metal carbide phase and a polycrystalline diamond phase onto the substrate overlying the base layer, the polycrystalline diamond phase being co-deposited with and distributed in the refractory metal carbide phase.

2. The method of claim 1 wherein the amount of polycrystalline diamond in the composite coating increases in portions of the coating increasing in distance from the base layer.

3. The method of claim 1 in which the base layer and the adherent composite coating are deposited to a total thickness up to about thirty micrometers.

4. The method of claim 1 wherein the gaseous mixture comprises stoichiometric proportions of the gaseous refractory metal halide, the gaseous hydrocarbon, and hydrogen to promote the formation of the refractory metal carbide in the base layer.

5. The method of claim 1 wherein the refractory metal is one of the group consisting of titanium, zirconium, vanadium, niobium, tantalum, chromium, molybdenum, and tungsten.

6. The method of claim 1 wherein the gaseous hydrocarbon consists essentially of one or more hydrocarbon compounds selected from the group consisting of alkanes, alkenes, alkynes, cycloalkanes and arenes.

7. The method of claim 1 wherein the metallic binder comprises 5.5 wt. % to 11 wt. % of the substrate and is selected from the group consisting of cobalt, nickel, chromium, and alloys thereof.

8. The method of claim 1 wherein the gaseous mixture comprising the gaseous refractory metal halide, the gaseous hydrocarbon, and hydrogen has a temperature in the range of 600° C. to 1000° C. and a total gas pressure of between 10 and 100 torr.

9. The method of claim 1 wherein the metal carbide particles include carbides of tungsten and at least one of titanium, zirconium, vanadium, niobium, tantalum, chromium, and molybdenum.

10. A method for depositing an adherent diamond-containing coating on a substrate which comprises metal carbide particles dispersed in a metallic binder without modifying the metallic binder at a surface of the substrate, the method comprising:
contacting the surface of the substrate with a first gaseous mixture to deposit a chemically homogenous base layer of a polycrystalline refractory metal carbide on the surface of the substrate, wherein the first gaseous mixture comprises stoichiometric amounts of a gaseous refractory metal halide, a gaseous hydrocarbon, and hydrogen; and, thereafter
contacting the surface of the substrate with a second gaseous mixture to deposit an adherent composite coating onto the surface of the substrate overlying the base layer, wherein the adherent composite coating contains particles of diamond co-deposited with and distributed in a refractory metal carbide phase and the second gaseous mixture comprises different amounts of the gaseous refractory metal halide, the gaseous hydrocarbon and hydrogen.

11. The method of claim 10 wherein the first gaseous mixture is passed in contact with the surface of the substrate for less than two hours to deposit the chemically homogenous base layer of the polycrystalline refractory metal carbide on the surface of the substrate.

12. The method of claim 10 wherein the chemically homogenous base layer of the polycrystalline refractory metal carbide is deposited on the surface of the substrate to create nucleation sites for the subsequently deposited particles of diamond.

13. The method of claim 10 wherein the second gaseous mixture is passed in contact with the surface of the substrate for 2-8 hours to co-deposit the adherent composite coating onto the surface of the substrate overlying the base layer.

14. A method for depositing an adherent composite coating having a polycrystalline diamond phase and a refractory metal carbide phase onto a tool substrate comprising metal carbide particles in a metallic binder, the metal carbide particles and the metallic cobalt binder both initially being exposed at a surface of the tool substrate; the method comprising:

depositing a base layer consisting essentially of a polycrystalline refractory metal carbide onto the surface of the substrate by contacting the surface of the substrate with a first gaseous mixture comprising predetermined amounts of a gaseous refractory metal halide, a gaseous hydrocarbon, and hydrogen; and, thereafter depositing a composite coating onto the surface of the substrate overlying the base layer by contacting the surface of the substrate with a second gaseous mixture comprising different predetermined amounts of the gaseous refractory metal halide, the gaseous hydrocarbon and hydrogen, the composite coating including of a refractory metal carbide phase with diamond particles distributed therein.

15. The method of claim 14 wherein the predetermined amounts of the gaseous refractory metal halide, the gaseous hydrocarbon, and hydrogen in the first gaseous mixture are present in substantially stoichiometric proportions to promote deposition of the polycrystalline refractory metal carbide on the surface of the substrate, without promoting the deposition of graphite.

16. The method of claim 1 wherein the refractory metal carbide phase is a continuous phase and the polycrystalline diamond phase is a discontinuous phase.

17. The method of claim 1 wherein the substrate is a cutting tool, and the base layer and the composite coating are deposited only on a cutting edge of the tool.

18. The method of claim 1 wherein the gaseous mixture comprising the gaseous refractory metal halide, the gaseous hydrocarbon, and hydrogen has a temperature of approximately 800° C.

* * * * *